(12) United States Patent
Kozicki et al.

(10) Patent No.: US 12,527,236 B2
(45) Date of Patent: Jan. 13, 2026

(54) LATERAL PROGRAMMABLE METALLIZATION CELL DEVICES

(71) Applicant: ARIZONA BOARD OF REGENTS ON BEHALF OF ARIZONA STATE UNIVERSITY, Scottsdale, AZ (US)

(72) Inventors: Michael Kozicki, Phoenix, AZ (US); Ninad Chamele, Tempe, AZ (US); Mehmet Balaban, Phoenix, AZ (US)

(73) Assignee: ARIZONA BOARD OF REGENTS ON BEHALF OF ARIZONA STATE UNIVERSITY, Scottsdale, AZ (US)

(*) Notice: Subject to any disclaimer, the term of this patent is extended or adjusted under 35 U.S.C. 154(b) by 447 days.

(21) Appl. No.: 17/997,447

(22) PCT Filed: Apr. 30, 2021

(86) PCT No.: PCT/US2021/030157
§ 371 (c)(1),
(2) Date: Oct. 28, 2022

(87) PCT Pub. No.: WO2021/222742
PCT Pub. Date: Nov. 4, 2021

(65) Prior Publication Data
US 2023/0172079 A1   Jun. 1, 2023

Related U.S. Application Data

(60) Provisional application No. 63/018,395, filed on Apr. 30, 2020.

(51) Int. Cl.
*H10N 70/20* (2023.01)
*H10N 70/00* (2023.01)

(52) U.S. Cl.
CPC ......... *H10N 70/245* (2023.02); *H10N 70/028* (2023.02); *H10N 70/823* (2023.02); *H10N 70/8416* (2023.02); *H10N 70/8833* (2023.02)

(58) Field of Classification Search
CPC ............... H10N 70/245; H10N 70/823; H10N 70/8416; H10N 70/8833; H10N 70/883; G11C 13/0011
See application file for complete search history.

(56) References Cited

U.S. PATENT DOCUMENTS

| 4,712,879 A | 12/1987 | Lynam et al. |
| 4,904,338 A | 2/1990 | Kozicki |

(Continued)

FOREIGN PATENT DOCUMENTS

| CN | 113517393 A | 10/2021 |
| DE | 102020122109 A1 | 10/2021 |

(Continued)

OTHER PUBLICATIONS

Gopalan et al., Structure of copper-doped tungsten oxide films for solid-state memory, Journal of Non-Crystalline Solids 353 (2007) 1844-1848 (Year: 2007).*

(Continued)

*Primary Examiner* — Shih Tsun A Chou
(74) *Attorney, Agent, or Firm* — Michael Best & Friedrich LLP

(57) ABSTRACT

Lateral programmable metallization cells may comprise a solid electrolyte layer, an anode coupled to the solid electrolyte layer, and a cathode coupled to the solid electrolyte layer. Exemplary solid electrolyte layers may comprise a first layer comprising an oxide electrolyte and a copper species and a second layer comprising at least one copper species, the second layer coupled to the first layer.

7 Claims, 6 Drawing Sheets

(56) References Cited

U.S. PATENT DOCUMENTS

| | | |
|---|---|---|
| 5,314,772 A | 5/1994 | Kozicki et al. |
| 5,434,917 A | 7/1995 | Naccache et al. |
| 5,761,115 A | 6/1998 | Kozicki et al. |
| 5,896,312 A | 4/1999 | Kozicki et al. |
| 5,914,893 A | 6/1999 | Kozicki et al. |
| 6,084,796 A | 7/2000 | Kozicki et al. |
| 6,388,324 B2 | 5/2002 | Kozicki |
| 6,418,049 B1 | 7/2002 | Kozicki et al. |
| 6,469,364 B1 | 10/2002 | Kozicki |
| 6,487,106 B1 | 11/2002 | Kozicki |
| 6,635,914 B2 | 10/2003 | Kozicki et al. |
| 6,798,692 B2 | 9/2004 | Kozicki et al. |
| 6,825,489 B2 | 11/2004 | Kozicki |
| 6,865,117 B2 | 3/2005 | Kozicki |
| 6,914,802 B2 | 7/2005 | Kozicki |
| 6,927,411 B2 | 8/2005 | Kozicki |
| 6,940,745 B2 | 9/2005 | Kozicki |
| 6,985,378 B2 | 1/2006 | Kozicki |
| 6,998,312 B2 | 2/2006 | Kozicki et al. |
| 7,006,376 B2 | 2/2006 | Kozicki |
| 7,085,928 B1 | 8/2006 | Schmid et al. |
| 7,101,728 B2 | 9/2006 | Kozicki et al. |
| 7,142,450 B2 | 11/2006 | Kozicki et al. |
| 7,145,794 B2 | 12/2006 | Kozicki |
| 7,169,635 B2 | 1/2007 | Kozicki et al. |
| 7,180,104 B2 | 2/2007 | Kozicki |
| 7,227,169 B2 | 6/2007 | Kozicki |
| 7,288,781 B2 | 10/2007 | Kozicki |
| 7,294,875 B2 | 11/2007 | Kozicki |
| 7,372,065 B2 | 5/2008 | Kozicki et al. |
| 7,385,219 B2 | 6/2008 | Kozicki et al. |
| 7,402,847 B2 | 7/2008 | Kozicki et al. |
| 7,405,967 B2 | 7/2008 | Kozicki et al. |
| 7,560,722 B2 | 7/2009 | Kozicki |
| 7,675,766 B2 | 3/2010 | Kozicki |
| 7,728,322 B2 | 6/2010 | Kozicki |
| 7,763,158 B2 | 7/2010 | Kozicki |
| 7,929,331 B2 | 4/2011 | Kozicki |
| 8,022,384 B2 | 9/2011 | Kozicki |
| 8,134,140 B2 | 3/2012 | Kozicki |
| 8,213,217 B2 | 7/2012 | Kozicki |
| 8,213,218 B2 | 7/2012 | Kozicki |
| 8,218,350 B2 | 7/2012 | Kozicki |
| 8,331,128 B1 | 12/2012 | Derhacobian et al. |
| 8,742,531 B2 | 6/2014 | Kozicki |
| 8,941,089 B2 | 1/2015 | Gopalan et al. |
| 8,999,819 B2 | 4/2015 | Kozicki et al. |
| 9,165,644 B2 | 10/2015 | Kamalanathan et al. |
| 9,431,606 B1 | 8/2016 | Ramaswamy et al. |
| 9,460,807 B2 | 10/2016 | Chung |
| 9,627,055 B1 | 4/2017 | Robustelli |
| 9,773,141 B2 | 9/2017 | Kozicki |
| 9,836,633 B2 | 12/2017 | Kozicki |
| 9,917,104 B1 | 3/2018 | Roizin et al. |
| 9,971,566 B2 | 5/2018 | Cambou |
| 9,985,791 B2 | 5/2018 | Cambou |
| 10,074,000 B2 | 9/2018 | Kozicki |
| 10,090,840 B1 | 10/2018 | Lee et al. |
| 10,223,567 B2 | 3/2019 | Kozicki |
| 10,467,447 B1 | 11/2019 | Kozicki |
| 10,558,172 B2 | 2/2020 | Kozicki |
| 10,710,070 B2 | 7/2020 | Kozicki et al. |
| 10,810,731 B2 | 10/2020 | Kozicki |
| 10,868,246 B2 | 12/2020 | Karpov et al. |
| 11,127,694 B2 | 9/2021 | Kozicki et al. |
| 11,244,722 B2 | 2/2022 | Kozicki |
| 2002/0127886 A1 | 9/2002 | Moore et al. |
| 2003/0107105 A1 | 6/2003 | Kozicki |
| 2004/0101729 A1 | 5/2004 | Kearl |
| 2004/0124407 A1 | 7/2004 | Kozicki et al. |
| 2005/0225413 A1 | 10/2005 | Kozicki et al. |
| 2006/0238185 A1 | 10/2006 | Kozicki |
| 2006/0291364 A1 | 12/2006 | Kozicki |
| 2007/0285148 A1 | 12/2007 | Sakamoto et al. |
| 2008/0296697 A1 | 12/2008 | Hsu et al. |
| 2010/0006813 A1 | 1/2010 | Haiwen et al. |
| 2010/0072448 A1 | 3/2010 | Khoueir et al. |
| 2010/0163829 A1* | 7/2010 | Wang ............... H10N 70/8418 29/25.03 |
| 2010/0193761 A1 | 8/2010 | Amin et al. |
| 2011/0180775 A1 | 7/2011 | Lin et al. |
| 2011/0254141 A1 | 10/2011 | Roest et al. |
| 2011/0286258 A1 | 11/2011 | Chen et al. |
| 2013/0134374 A1 | 5/2013 | Kim et al. |
| 2013/0220413 A1 | 8/2013 | Kozicki et al. |
| 2015/0069320 A1 | 3/2015 | Rabkin et al. |
| 2015/0123064 A1 | 5/2015 | Schubert et al. |
| 2015/0123065 A1 | 5/2015 | Petz et al. |
| 2015/0195088 A1 | 7/2015 | Rostami et al. |
| 2015/0280120 A1* | 10/2015 | Molas ............... H10N 70/8833 257/3 |
| 2015/0372060 A1 | 12/2015 | Terai et al. |
| 2017/0098469 A1 | 4/2017 | Park |
| 2017/0271403 A1* | 9/2017 | Yamamoto ........... H10N 70/245 |
| 2018/0012657 A1 | 1/2018 | Shih et al. |
| 2018/0088059 A1 | 3/2018 | Kozicki |
| 2018/0211703 A1 | 7/2018 | Choi et al. |
| 2019/0197265 A1 | 6/2019 | Kozicki |
| 2019/0221739 A1 | 7/2019 | Kim et al. |
| 2019/0335252 A1 | 10/2019 | Ryan |
| 2019/0378638 A1 | 12/2019 | Liu et al. |
| 2020/0006649 A1 | 1/2020 | Jiang et al. |
| 2020/0036037 A1 | 1/2020 | Krause et al. |
| 2020/0117882 A1 | 4/2020 | Kozicki |
| 2020/0203604 A1 | 6/2020 | Pillarisetty et al. |
| 2020/0272797 A1 | 8/2020 | Kozicki |
| 2020/0338556 A1 | 10/2020 | Kozicki et al. |
| 2020/0381372 A1 | 12/2020 | Kozicki et al. |
| 2021/0090649 A1 | 3/2021 | Kozicki et al. |
| 2021/0175185 A1 | 6/2021 | Kozicki et al. |
| 2021/0305508 A1 | 9/2021 | Lee et al. |
| 2021/0351348 A1 | 11/2021 | Hsu et al. |
| 2022/0148982 A1 | 5/2022 | Kozicki et al. |
| 2022/0262433 A1 | 8/2022 | Kozicki |
| 2023/0206964 A1 | 6/2023 | Shen et al. |
| 2023/0274893 A1 | 8/2023 | Andree |

FOREIGN PATENT DOCUMENTS

| | | |
|---|---|---|
| KR | 101566949 B1 | 11/2015 |
| WO | WO 1997048032 A2 | 12/1997 |
| WO | WO 1997048032 A3 | 12/1997 |
| WO | WO 1999028914 A2 | 6/1999 |
| WO | WO 2000048196 A1 | 8/2000 |
| WO | WO 2002021542 A1 | 3/2002 |
| WO | WO 2002082452 A2 | 10/2002 |
| WO | WO 2002099517 A2 | 12/2002 |
| WO | WO 2003028098 A2 | 4/2003 |
| WO | WO 2003032392 A2 | 4/2003 |
| WO | WO 2003036735 A2 | 5/2003 |
| WO | WO 2003058638 A1 | 7/2003 |
| WO | WO 2003079463 A2 | 9/2003 |
| WO | WO 2005083810 A2 | 9/2005 |
| WO | WO 2005124788 A2 | 12/2005 |
| WO | WO 2006043185 A1 | 4/2006 |
| WO | WO 2012065076 A1 | 5/2012 |
| WO | 2018057021 A1 | 3/2018 |
| WO | WO 2018175973 A1 | 9/2018 |
| WO | 2019066964 A1 | 4/2019 |

OTHER PUBLICATIONS

Banno et al., Diffusivity of Cu Ions in Solid Electrolyte and Its Effect on the Performance of Nanometer-Scale Switch, IEEE Transactions on Electron Devices, vol. 55, No. 11, Nov. 2008, pp. 3283-3287 (Year: 2008).*

English Machine Translation of Kang et al. (KR101566949B1) dated Jun. 30, 2014. (Year: 2014).

Abtew, M. Zhang, and D. A. Drabold, "Ab initio estimate of temperature dependence of electrical conductivity in a model amorphous material: Hydrogenated amorphous silicon," Phys. Rev. B 76, 045212 (2007).

(56) References Cited

OTHER PUBLICATIONS

Balakrishnan, S. C. P. Thermadam, M. Mitkova, and M. N. Kozicki, "A Low Power Non-Volatile Memory Element Based on Copper in Deposited Silicon Oxide," in 2006 7th Annual Non-Volatile Memory Technology Symposium, 2006, pp. 104-110.

Barranco, F. Yubero, J. P. Espinos, P. Groening, A. R. Gonzalez-Elipe, Electronic state characterization of SiOx thin films prepared by evaporation, J. Appl. Phys. 97, 113714 (2005).

Barranco, J. A. Mejias, J. P. Espinos, A. Caballero, A. R. Gonzalez-Elipe, F. Yubero, Chemical stability of Si+n species in SiOx (x<2) thin films, J. Vac. Sci. Technol. A 19(1) Jan./Feb. 2001.

Barranco, J. Cotrino, F. Yubero, J. P. Espinos, A. R. Gonzalez-Elipe, Room temperature synthesis of porous SiO2 thin-films by plasma enhanced chemical vapor deposition, J. Vac. Sci. Technol. A (4), Jul./Aug. 2004.

Belandi et al., SiO2 Etch Rate Modification by ion Implantation, Solid State Phenomena, vol. 195, pp. 55-57, Dec. 2012.

Bernard, V. T. Renard, P. Gonon, and V. Jousseaume, "Back-end-of-line compatible Conductive Bridging RAM based on Cu and SiO2," Microelectron. Eng., vol. 88, No. 5, pp. 814-816, 2011.

Bhattarai and D. A. Drabold, Vibrations in amorphous silica, J. Non. Cryst. Sol. 439 6 (2016).

Boyd and J. I. B. Wilson, A study on thin silicon dioxide films using infrared absorption techniques, J. App. Phys. 53 (6), pp. 4166-4171, Jun. 1982.

Cambou et al., PUF designed with ReRAM and ternary states; CISR 2016, pp. 1-8.

Cambou, F. Afghah, D. Sonderegger, J. Taggart, H. Barnaby, M. N. Kozicki, Ag conductive bridge RAMs for physical unclonable functions, Proceeding of the IEEE Host Conference, 2017, vol. 1, pp. 151-151.

Chen et al., "Total-Ionizing-Dose Effects on Resistance Stability of Programmable Metallization Cell Based Memory and Selectors," IEEE Trans. Nucl. Sci., vol. 64, No. 1, pp. 269-276, 2017.

Chen, J. Wu, Q. Zhang and X. Su, Recent advancement of SiOx based anodes for lithium-ion batteries, J. Power Sources 363, 126 (2017).

Chen, S. Tappertzhofen, H. Barnaby, M. N. Kozicki, SiO2 based conductive bridging random access memory, J Electroceram (2017) 39:109-131.

Chen, W. et al., "Volatile and Non-Volatile Switching in Cu—SiO2 Programmable Metallization Cells", IEEE Electron Device Letters, May 2016 [IEEE Date of Publication: Mar. 2016], vol. 37, No. 5, pp. 580-583 <DOI:10.1109/LED.2016.2540361>.

Choi et al., "Data clustering using memristor networks," Scientific Reports, 5:10492, 2015.

De Los Santos Valladares et al., "Crystallization and electrical resistivity of Cu2O and CuO obtained by thermal oxidation of Cu thin films on SiO2/Si substrates," Thin Solid Films, vol. 520, No. 20, pp. 6368-6374, 2012.

Dearnaley, A. Stoneham, D. Morgan, Electrical phenomena in amorphous oxide films. Rep. Prog. Phys. 33, 1129 (1970).

Ghijsen et al., "Electronic structure of Cu2O and CuO," Phys. Rev. B, vol. 38, No. 16, pp. 11322-11330, 1988.

Gilbert et al. "A 0.6 V 8 pJ/write Non-Volatile CBRAM Macro Embedded in a Body Sensor Node for Ultra Low Energy Applications." VLSI Circuits (VLSIC), 2013 Symposium on. IEEE, 2013.

Gopalan, M. N. Kozicki, S. Bhagat, S. C. Puthen Thermadam, T. L. Alford, and M. Mitkova, "Structure of copper-doped tungsten oxide films for solid-state memory," J. Non. Cryst. Solids, vol. 353, No. 18-21, pp. 1844-1848, 2007.

Gopalan, M. N. Kozicki, S. Bhagat, S. C. Puthen Thermadam, T. L. Alford, and M. Mitkova, "Structure of coppe-doped tungsten oxide films for solid-state memory, " J. Non. Cryst. Solids, vol. 353, No. 18-21 pp. 1844-1848, 2007.

Grassini, M. Ishtaiwi, M. Parvis, L. Benussi, S. Bianco, S. Colafranceschi, D. Piccolo, SiOx coated plastic fiber optic sensor for gas monitoring in RPC, Proceeding of Science, (RPC2012)072.

Herasimenka, W. J. Dauksher, M. Boccard, S. Bowden, ITO/SiOx:H stacks for silicon heterojunction solar cells, Solar Energy Materials & Solar Cells 158 (2016) pp. 98-101.

Hernandez, et al., Tailoring the Surface density of silicon nanocrystals embedded in SiOx single layers, J. Appl. Phys. 114, 233101 (2013).

International Preliminary Report on Patentability for Application No. PCT/US2018/024156 dated Oct. 3, 2019 (14 pages).

International Search Report and Written Opinion for Application No. PCT/US2018/024156 dated Jul. 13, 2018 (16 pages).

International Search Report and Written Opinion for Application No. PCT/US2021/030157 dated Sep. 22, 2021 (16 pages).

Jayatissa, K. Guo, and A. C. Jayasuriya, "Fabrication of cuprous and cupric oxide thin films by heat treatment," Appl. Surf. Sci., vol. 255, No. 23, pp. 9474-9479, 2009.

Kang, B. Arnold, C. J. Summers, B. K. Wagner, Synthesis of silicon quantum dot buried SiOx films with controlled luminescent properties for solid-state lighting, Nanotechnology 17 (2006) pp. 4477-4482.

Kim et al., "A Physical Unclonable Function with Redox-based Nanoionic Resistive Memory," arXiv:1611.04665v1 [cs.ET], (2016).

Klingsporn, S. Kirner, C. Villringer, D. Abou-Ras, I. Costina, M. Lehmann, and B. Stannowski, Resolving the nanostructure of plasma-enhanced chemical vapor deposited nanocrystalline SiOx layers for application in solar cells, J. Appl. Phys. 119, 223104 (2016).

Koffyberg and F. A. Benko, "A photoelectrochemical determination of the position of the conduction and valence band edges of p-type CuO," J. Appl. Phys., vol. 53, No. 2, pp. 1173-1177, 1982.

Kozicki and H. J. Barnaby, "Conductive bridging random access memory—Materials, devices and applications," Semicond. Sci. Technol., vol. 31, No. 11, 2016.

Kozicki et al., "Nonvolatile memory based on solid electrolytes," in Proc. IEEE Non-Volatile Memory Technol. Symp., pp. 10-17, 2004.

Kozicki et al., "Nanoscale memory elements based on solid-state electrolytes," IEEE Trans. Nanotechnol, vol. 4, pp. 331-338, May 2005.

Kozicki et al., "Programmable metallization cell memory based on Ag—Ge—S and Cu—Ge—S solid electrolytes," Proc. NVMTS, p. 83-89, 2005.

Kozicki, C. Gopalan, M. Balakrishnan, and M. Mitkova, "A low-power nonvolatile switching element based on copper-tungsten oxide solid electrolyte," IEEE Trans. Nanotechnol., vol. 5, No. 5, pp. 535-544, 2006.

Kozicki, et al., Copper-Silicon oxide resistive memory: A versatile back-end-of-line technology, invited presentation, Memrisys 2019, Dresden, Jul. 8-11.

Kozicki, M. Mitkova, M. Park, M. Balakrishnan, and C. Gopalan, "Information storage using nanoscale electrodeposition of metal in solid electrolytes," Superlattices Microstruct., vol. 34, No. 3-6, pp. 459-465, 2003.

Kozicki, P. Maroufkhani, and M. Mitkova, "Valving in microchannels via electrodeposition on solid electrolytes," vol. 1, No. Jan., pp. 716-719, 2005.

Kuzmin, A. Anspoks, A. Kalinko, J. Timoshenko, and R. Kalendarev, "X-ray absorption spectroscopy of Cu-doped WO3 films for use in electrochemical metallization cell memory," J. Non. Cryst. Solids, vol. 401, pp. 87-91, 2014.

Kwon et al., "Nanoscale CuO solid-electrolyte-based conductive-bridging-random-access-memory cell operating multi-level-cell and 1selector1resistor," J. Mater. Chem. C, vol. 3, No. 37, pp. 9540-9550, 2015.

Lucovsky, J. Manitini, Low temperature growth of silicon dioxide films: A study of chemical bonding by ellipsometry and infra-red spectroscopy, J. Vac. Sci. Technol. B 5 (2) Mar./Apr. 1987.

Mehonic, A. J. Kenyon, Emulating the Electrical Activity of the Neuron Using a Silicon Oxide RRAM Cell, Front. Neurosci. 10:57, 2016.

Mehonic, A. L. Shluger, D. Gao, I. Valov, E. Miranda, D. Ielmini, A. Bricalli, E. Ambrosi, C. Li, J. J. Yang, Q. Xia, A. J. Kenyon, Silicon Oxide (SiOx): A Promising Material for Resistance Switching?, Adv. Mater. 2018, 30, 1801187.

Mehonic, M. Buckwell, L. Montesi, L. Garnett, S. Hudziak, S. Fearn, R. Chater, D. McPhail, A. J. Kenyon, Structural changes and

(56) References Cited

OTHER PUBLICATIONS conductance thresholds in metal-free intrinsic SiOx resistive random access memory, J. Appl. Phys. 117, 124505 (2015).
Mehonic, M. Buckwell, L. Montesi, M. S. Munde, D. Gao, S. Hudziak, R. J. Chater, S. Fearn, D. McPhail, M. Bosman, A. L. Shluger, A. J. Kenyon, Nanoscale Transformations in Metastable, Amorphous, Silicon-Rich Silica Adv. Mater. 2016, 28, 7486-7493.
Mehonic, M.S. Munde, W.H. Ng, M. Buckwell, L. Montesi, M. Bosman, A.L. Shluger, A.J. Kenyon, Intrinsic resistance switching in amorphous silicon oxide for high performance SiOx ReRAM devices, Microelectronic Engineering, 178, 2017, pp. 98-103, (2017).
Mehonic, S. Cueff, M. Wojdak, S. Hudziak, C. Labbe, R. Rizk, A. J Kenyon, Electrically tailored resistance switching in silicon oxide, Nanotechnology 23 (2012) 455201 (9pp).
Mehonic, S. Cueff, M. Wojdak, S. Hudziak, O. Jambois, C. Labbé, B. Garrido, R. Rizk, A. J. Kenyon, Resistive switching in silicon suboxide films, J. Appl. Phys. 111, 074507 (2012).
Mickel et al., "A physical model of switching dynamics in tantalum oxide memristive devices," Appl. Phys. Lett., vol. 102, p. 223502, 2013.
Moore, "Moore's Law , Electronics," vol. 38, No. 8, p. 114, 1965.
Munde, A. Mehonic, W. H. Ng , M. Buckwell, L. Montesi, M. Bosman, A. L. Shluger, A. J. Kenyon, Intrinsic Resistance Switching in Amorphous Silicon Suboxides: The Role of Columnar Microstructure, Scientific Reports 7: 9274, 2017.
Murarka, "Multilevel interconnections for ULSI and GSI era," Mater. Sci. Eng. R Reports, vol. 19, No. 3-4, pp. 87-151, 1997.
Nandakumar, S. et al., "Physics-based switching model for Cu/SiO2/W quantum memristor", 2016 74th Annual Device Research Conference (DRC) (Jun. 19-22, 2016, Newark, DE, USA), Date Added to IEEE Xplore: Aug. 2016, 2 pages <DOI:10.1109/DRC.2016.7548509>.
Nesheva, C. Raptis, A. Perakis, I. Beneva, Z. Aneva, Z. Levi, S. Alexandrova, H. Hofmeister, Raman scattering and photoluminescence from Si nanoparticles in annealed SiOx thin films, J. Appl. Phys., vol. 92, No. 8, pp. 4678-4683 (2002).
Nili et al., "Donor-induced performance tuning of amorphous SrTiO3 memristive nanodevices: Multistate resistive switching and mechanical tunability," Advanced Functional Materials, vol. 25, No. 21, pp. 3172-3182, 2015.
Nili et al., "Nanoscale resistive switching in amorphous perovskite oxide (a-SrTiO3) memristors," Advanced Functional Materials, vol. 24, No. 43, pp. 6741-6750, 2014.
Novikov, V. A. Gritsenko, Short-range order in amorphous SiOx by x-ray photoelectron spectroscopy, J. Appl. Phys. 110, 014107 (2011).
O'Leary, J. H. Thomas, Characterization of reactively evaporated SiOx thin films, Journal of Vacuum Science & Technology A 5, 106 (1987).
Oxford Instruments, "Basic PECVD Plasma Processes," <https://nanolab.berkeley.edu/process_manual/chap6/6.20PECVD.pdf> dated 2003.
Oxley, Electroforming, switching and memory effects in oxide thin films. Act. Passive Electron. Compon. 3, 217, 1977.
Pai, S. S. Chao, Y. Takagi, G. Lucovsky, Infrared spectroscopic study of SiOx films produced by plasma enhanced chemical vapor deposition, J. Vac. Sci. Technol. A 4 (3) May/Jun. 1986.
Pandey, P. Biswas and D. A. Drabold, Force enhanced atomic refinement: application to amorphous silica and amorphous silicon, Phys. Rev. B 92 155205 (2015).
Park, K.S. Kim, M.H. Jung, WJ Cho and J. Jung, Electrical Characteristics of SiO2/High-k Dielectric Stacked Tunnel Barriers for Nonvolatile Memory Applications. Journal of The Korean Physical Society vol. 55. 10.3938/jkps.55.116 (2009).
Pearton, W. H. Heo, M. Ivill, D. P. Norton, and T. Steiner, "Dilute magnetic semiconducting oxides," Semicond. Sci. Technol., vol. 19, No. 10, pp. R59-R74, 2004.
Pelgrom et al., "Matching properties of MOS transistors," IEEE Journal of solid-state circuits, vol. 24, No. 5, pp. 1433-1439, 1989.
Pliskin, Comparison of properties of dielectric films deposited by various methods, Journ. of Vac. Sci. and Tech., vol. 14, No. 5, pp. 1064-1081, Sep./Oct. 1977.
Prasai et al., High precision detection of change in intermediate range order of amorphous zirconia-doped tantala thin films due to annealing, Phys. Rev. Lett. 123 045501 (2019).
Ramírez-Ortiz et al., "A catalytic application of Cu2O and CuO films deposited over fiberglass," Appl. Surf. Sci., vol. 174, No. 3-4, pp. 177-184, 2001.
Remache, et al. Design of porous silicon/PECVD SiOx antireflection coatings for silicon solar cells, Materials Science and Engineering B 176 (2011), pp. 45-48.
Schindler, M. Weides, M. N. Kozicki, R. Waser, Low current resistive switching in Cu—SiO2 cells, Appl. Phys. Lett. 92, 122910 (2008).
Shallenberger, Determination of chemistry and microstructure in SiOx (0.1<x<0.8) films by x-ray photoelectron spectroscopy, Journal of Vacuum Science & Technology A 14, 693 (1996).
Simmons, R. R. Verderber, New thin-film resistive memory, The Radio and Electronic Engineer, Aug. 1967.
Sopinskyy, V. Khomchenko, Electroluminescence in SiOx films and SiOx-film-based systems, Current Opinion in Solid State and Materials Science 7 (2003) 97-109.
Subedi, K. Prasai, M. N. Kozicki, and D. A. Drabold, Structural origins of electronic conduction in amorphous copper-doped alumina, Phys. Rev. Materials 3 065605 (2019).
Suzuki, Y. Ishikawa, M. Isshiki, and Y. Waseda, "Native Oxide Layers Formed on the Surface of Ultra High-Purity Iron and Copper Investigated by Angle Resolved XPS," Mater. Trans. JIM, vol. 38, No. 11, pp. 1004-1009, 1997.
Takayanagi, S. Akao, T. Yanagisawa, N. Nakaso, Y. Tsukahara, S. Hagihara, T. Oizumi, N. Takeda, T. Tsuji, K. Yamanaka, Detection of Trace Water Vapor Using SiOx-Coated Ball SAW Sensor, Materials Transactions, vol. 55, No. 7 (2014) pp. 988 to 993, 2014 The Japanese Society for Non-Destructive Inspection.
Thapa, B. Bhattarai, M. N. Kozicki, K. N. Subedi and D. A. Drabold, Structure and charge transport of amorphous Cu-doped tantalum pentoxide: an ab initio study, Phys. Rev. Materials 4 064603 (2020).
Tomozeiu, Electrical conduction and dielectric relaxation of a-SiOx (0<x<2) thin films deposited by reactive RF magnetron sputtering, Thin Solid Films 516 (2008) 8199-8204.
Tsunoda et al., "Low power and high speed switching of Ti-doped NiO ReRAM under the unipolar voltage source of less than 3 V," in IEEE International Electron Devices Meeting (IEDM), 2007, pp. 767-770.
U.S. Appl. No. 17/025,523, filed Sep. 18, 2020, Kozicki.
U.S. Appl. No. 17/050,750, filed Oct. 26, 2020, Kozicki et al.
U.S. Appl. No. 17/072,701, filed Oct. 16, 2020, Kozicki.
U.S. Appl. No. 17/100,028, filed Nov. 20, 2020, Kozicki.
U.S. Appl. No. 17/112,668, filed Dec. 4, 2020, Kozicki.
United States Patent Office Action for U.S. Appl. No. 17/025,523 dated Jul. 1, 2021 (14 pages).
Valov et al., "Electrochemical metallization memories—Fundamentals, applications, prospects," Nanotechnology, vol. 22, p. 254003, 2011.
Valov et al., "Nanobatteries in redox-based resistive switches require extension of memristor theory," Nature Communications, vol. 4, p. 1771, 2013.
Van Hapert, Hopping Conduction and Chemical Structure, a study on Silicon Suboxides, PHD Thesis, Universiteit Utrecht, 2012, ISBN 90-393-3063-8. (159 pages).
Wang, Yang Yang, Jae-Hwang Lee, Vera Abramova, Huilong Fei, Gedeng Ruan, Edwin L. Thomas, James M. Tour, Nanoporous Silicon Oxide Memory, Nano Lett. 2014, 14, 4694-4699.
Waser et al., "Nanoionics-based resistive switching memories," Nature Materials, vol. 6, No. 11, pp. 833-840, 2007.
Waser et al., "Redox-based resistive switching memories—nanoionic mechanisms, prospects, and challenges," Advanced materials, vol. 21, No. 25-26, pp. 2632-2663, 2009.
Willers et al., MEMS-based gyroscope as PUFs; CCS'16, Oct. 24-28, 2016, pp. 591-602.

(56) References Cited

OTHER PUBLICATIONS

Yang, Y. et al., "Novel Complementary Resistive Switch Crossbar Memory Write and Read Schemes", IEEE Transactions on Nanotechnology, Mar. 2015 [IEEE Date of Publication: Jan. 2015], vol. 14, No. 2, pp. 346-357 <DOI:10.1109/TNANO.2015.2394450>.

Yoshida, I. Umezu, N. Sakamoto, M. Inada, A. Sugimura, Effect of structure on radiative recombination processes in amorphous silicon suboxide prepared by rf sputtering, J. Appl. Phys. 92, 5936 (2002).

Zheng, C. N. Xu, E. Tanaka, Y. Tomokiyo, M. Suzuki, and E. S. Otabe, "Charge-spin-orbital coupling in CuO," Phys. C Supercond., vol. 357-360, pp. 181-185, 2001.

Zhou, Tao Du, Lijie Guo, Morten M. Smedskjaer, Mathieu Bauchy, New insights into the structure of sodium silicate glasses by force-enhanced atomic refinement, J. Non. Cryst. Sol. 536 120006 (2020).

\* cited by examiner

LATERAL PROGRAMMABLE METALLIZATION CELL DEVICES

CROSS-REFERENCE TO RELATED APPLICATIONS

The present application is related to and claims the priority benefit of U.S. Provisional Patent Application No. 63/018,395, filed Apr. 30, 2020, the entire contents of which are incorporated herein by reference.

INTRODUCTION

Lateral programmable metallization cell (PMC) structures have a wide range of potential applications. PMC devices rely on the electrodeposition of metal in a channel comprising a solid electrolyte between a pair of electrodes: an oxidizable anode that supplies metal ions and a cathode that supplies electrons to the redox-based deposition process. The electrodeposit changes the electrical, chemical, and mechanical properties of the channel region and this can be used in switches, micro-electromechanical systems (MEMS), and valves in microfluidic devices. In attempting to allow the inexpensive integration of PMC elements into circuitry by utilizing materials such as copper (Cu) and oxides of other materials ($WO_3$ or $SiO_x$), it was discovered that the low diffusivity of copper in these oxides resulted in the separation of the region where the ions are most abundant (close to the anode) from the electron supply (cathode). This slowed the electrodeposition process to the point where it was essentially non-existent at normal operating voltages for integrated electronics.

SUMMARY

In one aspect, a lateral programmable metallization cell is disclosed. Exemplary lateral programmable metallization cells may comprise a solid electrolyte layer, an anode coupled to the solid electrolyte layer, and a cathode coupled to the solid electrolyte layer. The solid electrolyte layer may comprise a first layer comprising an oxide electrolyte and a copper species and a second layer comprising at least one copper species, the second layer coupled to the first layer.

In another aspect, a method for making a lateral programmable metallization cell is disclosed. The method may comprise depositing a copper layer onto an oxide electrolyte layer, heating the copper and oxide electrolyte layers in an oxidizing environment to form a solid electrolyte, depositing a cathode onto the solid electrolyte, and depositing an anode onto the solid electrolyte. The solid electrolyte layer may comprise a first layer comprising an oxide electrolyte and a copper species and a second layer comprising at least one copper species.

In another aspect, a method for producing a lateral programmable metallization cell is disclosed. The method may comprise depositing a dielectric layer onto a silicon wafer, depositing an oxide electrolyte layer onto the dielectric layer, depositing a copper layer onto the oxide electrolyte layer, heating in an oxidizing ambient to drive the copper into the oxide electrolyte layer and form a copper oxide layer, depositing a photoresist layer onto the copper layer, patterning the photoresist layer to form an electrolyte channel in the copper layer and the oxide layer, depositing an anode onto the electrolyte channel, and depositing a cathode onto the electrolyte channel.

Other aspects of the disclosure will become apparent by consideration of the detailed description and accompanying drawings.

BRIEF DESCRIPTION OF THE DRAWINGS

FIG. 2A is a schematic representation of one example of a vertical PMC in an off state condition with no bias. FIG. 2B is a schematic representation of one example of a vertical PMC in which oxidation of metal in top electrode to metal ions and growth of a metallic filament by reduction on the electrodeposit during forward bias. FIG. 2C is a schematic representation of one example of a vertical PMC in an on state condition where the anode and the cathode are bridged. FIG. 2D is a schematic representation of one example of a vertical PMC in which Oxidation of the electrodeposit and reduction of metal ions back at the anode during reverse bias.

DETAILED DESCRIPTION

Before any embodiments of the disclosure are explained in detail, it is to be understood that the disclosure is not limited in its application to the details of construction and the arrangement of components set forth in the following description or illustrated in the following drawings. The disclosure is capable of other embodiments and of being practiced or of being carried out in various ways.

Conventional lateral programmable metallization cell (PMC) devices have slow electrodeposition reaction rates, and therefore are unusable for applications which require a rapid change in state because of the formation of an electrodeposit. To address at least this problem, the instant disclosure is directed to forming a bilayer solid electrolyte (BSE). In some implementations, the BSE is formed by the oxidation of a thin Cu film on a $WO_3$ layer and simultaneous diffusion of Cu into the $WO_3$ at moderate processing temperature in an oxygen or air ambient until all the metallic Cu is consumed. Materials and fabrication processes disclosed herein are compatible with current back-end-of-line (BEOL) approaches in the semiconductor industry.

Copper (Cu) and tungsten (W) are both widely used in the electronics industry and in integrated circuits (ICs) in particular. They are commonly found in back-end-of-line (BEOL) interconnect schemes where copper forms the metal tracks in multiple layers and tungsten is used in vias which connect the copper layers together. In addition to their use in the BEOL, copper and tungsten are also utilized as the electrode materials (anode and cathode respectively) in Programmable Metallization Cell (PMC) or Conductive Bridge Random Access Memory (CBRAM) devices. Oxides of these metals (CuO and $WO_3$) can be used as the solid-electrolyte (SE) layers in PMCs. The foundry-ready nature of these materials make them attractive as it provides a relatively simple route to mass manufacturing at low cost.

Figure 1A:
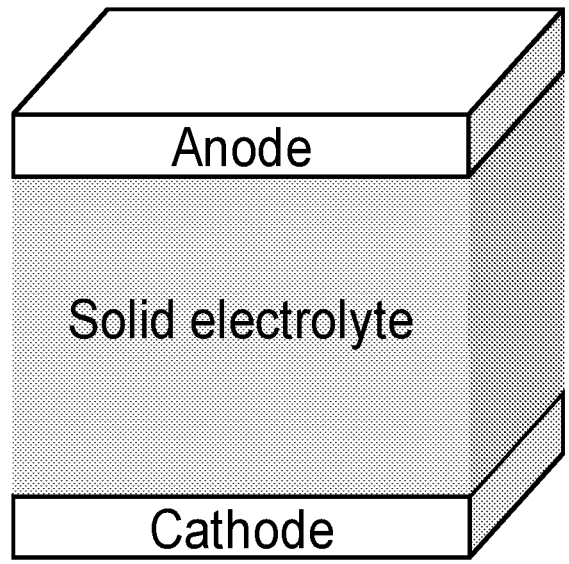
FIG. 1A is one example of a vertical configuration of a programmable metallization cell (PMC).
Figure 1B:
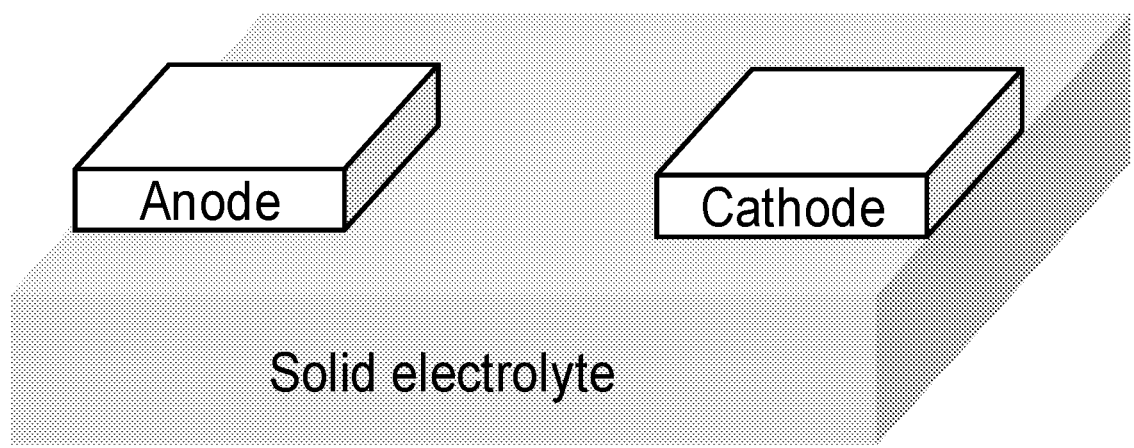
FIG. 1B is one example of a lateral configuration of a PMC.
Figure 2A:
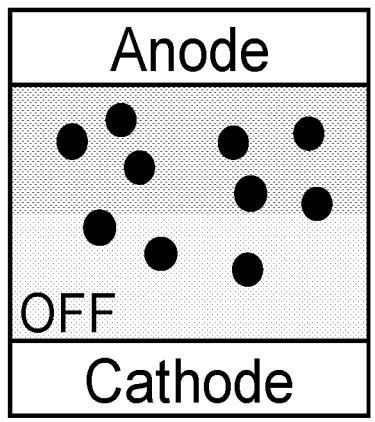
FIGS. 2A-2D are a schematic representations of one example of switching in a vertical PMC where the circles denote anode material.
Figure 2B:
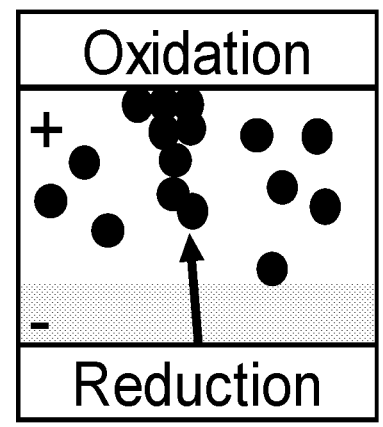
Figure 2C:
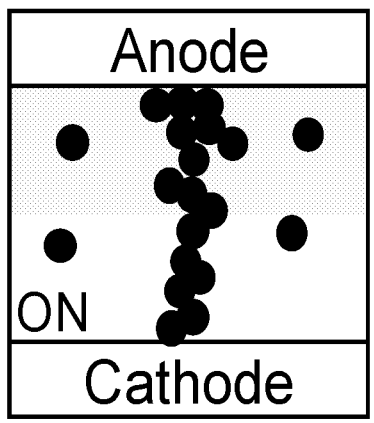
Figure 2D:
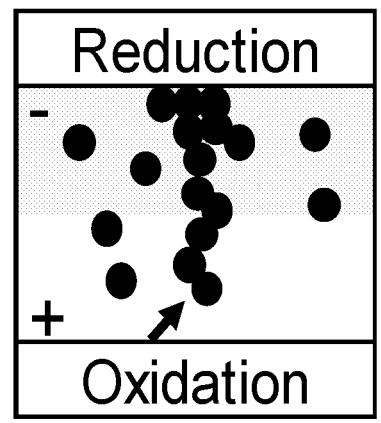

PMC devices offer versatility for a variety of applications due to the ability to use different configurations of the anode-SE-cathode structure. Vertical PMCs, shown schematically in FIG. 1A, may be used as memory and selector devices. Lateral PMCs, shown schematically in FIG. 1B, may be used as radio frequency switches, microfluidic valves, and tuning elements in MEMS devices.

In PMC devices, the solid-electrolyte is a thin film that enables the transport of metal ions from the anode. Silver (Ag) and chalcogenide glasses (ChG) such as Ge—Se and Ge—S have been used in PMCs as the anode and solid electrolyte respectively, but these are not as BEOL-friendly as copper and oxide-based electrolytes. In some instances, the cathode material may be an inert conductor such as Ni, W, Pt, or TiN as explained later.

As-fabricated PMC devices may have a high resistance state (HRS) because the electrolyte is typically a poor electron conductor. When there is a positive bias on the anode with respect to the cathode that is above the potential for nucleation and redox reactions to occur, the anode material oxidizes ($M \rightarrow M^{z+} ze^- \rightarrow M$) at the anode/solid electrolyte interface and an electrodeposit in the form of a conductive filament grows between the electrodes. The oxidized cation reduces to its metallic state ($M^{z+} + ze^- \rightarrow M$) usually at the cathode or on the electrodeposit but also where electrons are present at nucleation sites within the electrolyte. Once the electrodeposit bridges the electrodes, the resistance of the PMC cell reduces drastically, resulting in a low resistance state (LRS). In order to reverse this process, the bias between the electrodes is reversed and the electrodeposit breaks and is oxidized, and metal ions drift back to the anode where they get reduced and redeposited.

The non-oxidizability of the inert electrode ensures that no electrodeposition occurs in the opposite direction under reverse bias. PMC device performance may therefore be dependent upon the drift of the metal ions in the solid electrolyte and the redox reactions occurring at the electrodes or at the edge of the electrodeposit. While the Ag-ChG PMC devices show fast switching due to the superionic material created by the introduction of the Ag into the ChG, oxide-based PMC devices, for example, Cu—$WO_3$ or Cu—$SiO_x$, typically exhibit slower switching for similar solid electrolyte layer thickness.

Other operational difference between ChG- and oxide-based devices is the position of the initial reduction reaction due to the distribution of the ions in the electrolyte. The low diffusivity/mobility of the metal (typically Cu) ions in the oxides tends to create a concentration gradient from anode to cathode so that reduction occurs closer to the anode via electrons which travel through the electrolyte to where the metal is relatively abundant. ChG-based fast ion conductors have metal ions throughout the electrolyte which favors growth at the cathode where both ions and electrons are plentiful. A schematic representation of switching in an oxide-based PMC device is shown in FIG. 2A-FIG. 2D.

In fast switching vertical PMC structures, the electrodes are separated by a thin (a few nm to a few tens of nm thick) solid electrolyte. Lateral devices offer functionality in areas that depart considerably from memory and storage. The relatively large solid electrolyte channel length between anode and cathode in lateral devices facilitates a very large HRS but with a low off-state capacitance, which may be optimal for the isolation necessary in RF switches. The large channel also allows considerable electrodeposited mass to be moved from the anode toward the cathode which produces a very low LRS when this mass forms a bridging connection between the electrodes. This may be optimal for RF switches and other applications such as programmable interconnect. This mass transfer has also been used to control MEMS and microfluidic structures. Lateral PMC devices can be used as timing devices, as the large channel length can be used to "slow down" the electrodeposition process to allow timing to be performed for periods ranging from seconds to years, depending on the material composition, device geometry, and voltage applied.

One issue with oxide-based lateral devices with relatively long channel lengths (several µm or more) is that the electrons from the cathode are unable to traverse the relatively high resistivity electrolyte to reach the abundant metal ions at the anode region and so the electrodeposition reaction can be too slow to be useful for most applications or essentially non-existent. The electron supply may be affected by providing a resistive or semiconducting "shunt" along the electrolyte which has a resistance that is high enough to allow a bias to be applied between the electrodes that will promote the redox reactions but low enough to provide sufficient electron current for relatively rapid electrodeposition away from the cathode.

$Cu_2O$ is one example of a material that can be used for the shunt. Although Cu oxides are typically not used in ICs per se, Cu oxide formation has been studied as the oxidation of the metal during handling, even at room temperature, could impact circuit/interconnect scaling. Cuprous oxide ($Cu_2O$) is a p-type semiconductor that has a cubic structure with a bandgap in the range of 1.8-2.5 eV (cupric oxide, CuO, is an antiferromagnetic semiconductor that has a monoclinic structure with a bandgap in the range of 1.21-2.00 eV). $Cu_2O$ is used in other applications such as solar cells, spintronics and catalysis. CuO is used in the fields of photo-thermal and photoconductive materials and high temperature (Tc) superconductors.

This disclosure presents, among other things, methods for the formation of a BEOL-compatible bilayer solid electrolyte (BSE) for use in lateral PMC devices. In some instances, exemplary BSEs may be formed by the oxidation of a thin copper film on an oxide electrolyte layer and simultaneous diffusion of Cu into the $WO_3$ at moderate processing temperature (125° C.-170° C.) in an air ambient. Exemplary approaches may involve minimal processing of BEOL-compatible materials at BEOL-compatible temperatures and may allow for tailoring characteristics of the BSE, particularly the resistance of the $Cu_2O$ layer, via the initial thickness of the Cu film. This, in turn, may permit control of the growth rate of the electrodeposit from very slow (taking years to bridge the channel) for long term timing applications, to fast (seconds) for applications in reconfigurable electronics, MEMS and microfluidics.

I. Exemplary Lateral Programmable Metallization Cells

Figure 3:
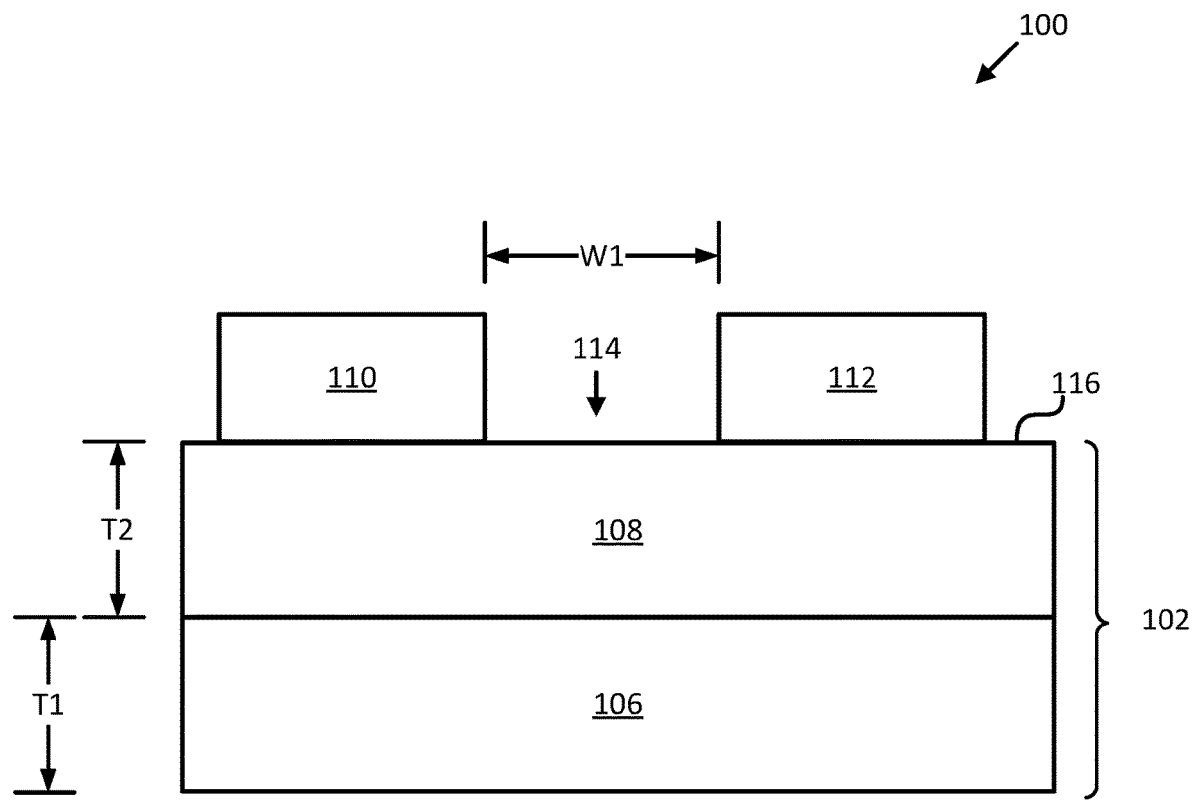
FIG. 3 is a schematic side plan view of an exemplary lateral programmable metallization cell.

FIG. 3 is a schematic side plan view of an exemplary lateral programmable metallization cell (LPMC) 100. LPMC 100 comprises solid electrolyte 102, anode 110, and cathode 112. Other embodiments can include more or fewer components.

Broadly, solid electrolyte 102 enables transport of metal ions from anode 110. Solid electrolytes disclosed herein have a bilayer configuration including a first layer 106 and a second layer 108 coupled and adjacent to the first layer 106.

Exemplary first layers 106 comprise one or more oxide electrolytes In various instances, the one or more oxide electrolytes may comprise tungsten (VI) oxide ($WO_3$) (also referred to as tungsten trioxide or tungstic anhydride), a silicon oxide ($SiO_x$), where x may be less than 2 or on the order of 1.3, and/or tantalum pentoxide ($Ta_2O_5$) (also referred to as tantalum (V) oxide).

During or after manufacturing, or during operation, exemplary first layers 106 may comprise one or more oxide electrolytes and metal dopant. Exemplary metal dopant may comprise a metal that forms mobile ions in the solid electrolyte 102. In various instances, metal dopant may be copper, silver, zinc, or iron. As non-limiting examples, in various implementations, first layers 106 may comprise copper-doped tungsten oxide, copper-doped silicon oxide, or copper-doped tantalum pentoxide.

In some instances, the first layer 106 of LPMC 100 is connected to, adhered to, or otherwise coupled to a substrate, not shown in FIG. 3. Example substrates may include silicon wafers and silicon wafers with a $Si_3N_4$ coating.

First layer 106 has a thickness T1. Exemplary first layers 106 may have various thicknesses T1 depending upon the implementation. In some instances, a thickness T1 of exemplary first layers 106 may be sufficient to consume a portion of the copper oxide in the second layer 108 that is not diffused into the first layer.

For example, first layers 106 may have a thickness T1 between about 1 nm and about 900 nm. In various implementations, exemplary first layers 106 may have a thickness T1 that is no more than 900 nm; no more than 750 nm; no more than 500 nm; no more than 250 nm; no more than 150 nm; no more than 100 nm; no more than 85 nm; no more than 80 nm; no more than 50 nm; or no more than 25 nm. In various implementations, exemplary first layers 106 may have a thickness T1 that is at least 1 nm; at least 25 nm; at least 50 nm; at least 75 nm; at least 85 nm; at least 100 nm; at least 150 nm; at least 250 nm; at least 500 nm; at least 750 nm; or at least 850 nm. In various implementations, exemplary first layers 106 may have a thickness T1 between 1 nm and 900 nm; 1 nm and 500 nm; 1 nm and 250 nm; 1 nm and 100 nm; 1 nm and 85 nm; 10 nm and 85 nm; 50 nm and 85 nm; 60 nm and 85 nm.

Exemplary second layers 108 comprise copper oxide ($Cu_2O$). During manufacture, a copper (Cu) film may be applied to the first layer 106 and the Cu film is subjected to oxidizing techniques, resulting in second layer 108. In some instances, second layers 108 may consist essentially of, or consist of copper oxide ($Cu_2O$).

In some instances, second layers 108 may comprise metallic (that is, non-oxidized) copper (Cu) as well as copper oxide ($Cu_2O$). In some implementations, copper (Cu) may be present in second layer 108 at from 0.1 volume percent (vol. %) to about 30 vol. % of copper oxide ($Cu_2O$). In various instances, an amount of copper (Cu) relative to copper oxide ($Cu_2O$) may be no more than 30 vol. %; no more than 25 vol. %; no more than 20 vol. %; no more than 15 vol. %; no more than 10 vol. %; no more than 5 vol. %; no more than 1 vol. %; no more than 0.75 vol %; no more than 0.5 vol. %; or no more than 0.25 vol. %. In various instances, an amount of copper (Cu) relative to copper oxide ($Cu_2O$) may be at least 0.1 vol. %; at least 0.5 vol. %; at least 1.0 vol. %; at least 5.0 vol. %; at least 10.0 vol. %; at least 15.0 vol. %; at least 20.0 vol. %; or at least 25.0 vol. %. In various instances, an amount of copper (Cu) relative to copper oxide ($Cu_2O$) may be 0.1 to 30 vol. %; 1.0 to 20 vol. %; 5.0 to 15.0 vol. %; 0.1 to 10.0 vol. %; 10.0 to 20.0 vol. %; 20.0 to 30.0 vol. %; 0.1 to 5.0 vol. %; 5.0 to 10.0 vol. %; 10.0 to 15.0 vol. %; 15.0 to 20.0 vol. %; 20.0 to 25.0 vol. %; or 25.0 to 30.0 vol. %.

Second layer 108 has a thickness T2. Exemplary second layers may have various thicknesses depending upon the implementation. In some instances, a thickness of exemplary second layers may be thin enough to be formed by low temperature oxidation in ambient air.

Exemplary second layers may have a thickness between about 1 nm and about 50 nm. In various implementations, exemplary second layers may have a thickness that is no greater than 50 nm; no greater than 40 nm; no greater than 30 nm; no greater than 20 nm; no greater than 10 nm; or no greater than 5 nm. In various implementations, exemplary second layers may have a thickness that is no less than 5 nm; no less than 10 nm; no less than 15 nm; no less than 20 nm; no less than 30 nm; or no less than 40 nm. In various implementations, exemplary second layers may have a thickness between 1 nm and 50 nm; 1 nm and 40 nm; 1 nm and 30 nm; 1 nm and 20 nm; 1 nm and 10 nm; 5 nm and 20 nm; or 5 nm and 15 nm.

The arrangement of LPMC 100 is an example lateral configuration, where the anode 110 and cathode 112 are coupled to a same surface of the solid electrolyte 102. In contrast, vertical configurations have an anode and a cathode coupled to opposite surfaces of a solid electrolyte.

As used herein, "coupled" means physically and/or chemically bonded to. Electrons may move between the anode 110 and solid electrolyte 102 and between the cathode 112 and the solid electrolyte 102. In some instances, the anode 110 and cathode 112 may be deposited onto the solid electrolyte 102 using various techniques known in the art, such as by e-beam evaporation.

Various materials may be used for the anode 110. Typically, anode 110 materials are metals that may form mobile ions in the solid electrolyte 102. In some instances, the anode 110 comprises copper (Cu), silver (Ag), zinc (Zn), or iron (Fe).

Various materials may be used for the cathode 112. Typically, exemplary cathode materials are inert conductors. In various implementations, the cathode 112 may comprise nickel (Ni), tungsten (W), platinum (Pt), and/or titanium nitride (TiN).

In the lateral configuration of LPMC 100, channel 144 extends from anode 110 to cathode 112. Channel 114 may be etched beneath a top surface 116 of solid electrolyte 102, and extend into second layer 108, or extend through second layer 108 and into first layer 106. Channel 114 has width W1 and a length (not shown in FIG. 3). Channel width W1 may be constant or nearly constant along the length of channel 114 between anode 110 and cathode 112.

Channel width W1 may vary depending upon the implementation. In some instances, channel width W1 may be between about 10 μm and about 55 μm. In various implementations, channel width W1 may be no more than 55 μm; no more than 50 μm; no more than 40 μm; no more than 30 μm; no more than 20 μm; or no more than 15 μm. In various implementations, channel width W1 may be no less than 10 μm; no less than 20 μm; no less than 30 μm; no less than 40 μm; or no less than 50 μm. In various implementations, channel width W1 may be between 10 μm and 55 μm; 20 μm and 55 μm; 30 μm and 55 μm; 40 μm and 55 μm; 40 μm and 50 μm; or 45 μm and 55 μm.

A length of channel 114 may vary depending upon the implementation. In some instances, a channel length may be between about 5 µm and about 25 µm. In various implementations, a channel length may be no more than 25 µm; no more than 20 µm; no more than 15 µm; no more than 10 µm; or no more than 8 µm. In various implementations, a channel length may be no less than 5 µm; no less than 10 µm; no less than 14 µm; or no less than 20 µm. In various implementations, a channel length may be between 5 µm and 25 µm; 5 µm and 20 µm; 10 µm and 20 µm; 10 µm and 25 µm; or 10 µm and 15 µm.

III. Exemplary Methods of Manufacture

Exemplary LPMCs may be manufactured using various methods. An example method for making a lateral programmable metallization cell may comprise depositing a layer onto a substrate. That layer comprises one or more oxide electrolytes. Exemplary oxide electrolytes may include $WO_3$, $SiO_x$, where x may be less than 2 or on the order of 1.3, and/or $Ta_2O_5$. Exemplary thicknesses of this layer are described in greater detail above.

Various substrates may be used, such as a silicon wafer, and other substrates are discussed above. In some instances, a dielectric layer is deposited onto the substrate before depositing the layer comprising one or more oxide electrolytes. An example dielectric layer may comprise $Si_3N_4$ and may be about 200 nm thick. Other thicknesses are contemplated.

Then a layer of copper (Cu) may then be deposited onto the oxide electrolyte layer. Depositing the oxide electrolytes and the copper may be performed using various deposition techniques. Example physical vapor techniques may include e-beam evaporation, sputtering, and thermal evaporation. Other example techniques may include chemical vapor deposition, epitaxial growth, and atomic layer deposition.

After depositing the copper layer, the layers are heated (annealed) in an oxidizing environment to generate a solid electrolyte. Without being bound by a particular theory, it appears that during oxidation operations, some copper species diffuse into the oxide electrolyte layer and some copper species are oxidized to copper oxide ($Cu_2O$). As a result, the solid electrolyte comprises a $Cu$—$WO_3$ solid electrolyte layer, which can supply copper ions for the electrodeposition process, and a semiconducting $Cu_2O$ (or $Cu$—$Cu_2O$) layer that can bring electrons to where the ions are most abundant.

The oxidizing environment may comprise one or more oxidizing species. For example, the oxidizing environment may comprise, consist of, or consist essentially of oxygen ($O_2$). As another example, the oxidizing environment may comprise ambient air (a mixture of oxygen ($O_2$), nitrogen ($N_2$), and one or more other species such as carbon, helium, methane, argon, and/or hydrogen).

The oxidizing environment may have a temperature between about 120° C. and about 155° C. In various implementations, the oxidizing environment may have a temperature no greater than 155° C.; no greater than 150° C.; no greater than 145° C.; no greater than 140° C.; no greater than 135° C.; or no greater than 130° C. in various implementations, the oxidizing environment may have a temperature no less than 120° C.; no less than 125° C.; no less than 130° C.; no less than 135° C.; no less than 140° C.; no less than 145° C.; or no less than 150° C. In various implementations, the oxidizing environment may have a temperature between 120° C. and 155° C.; 120° C. and 150° C.; 130° C. and 150° C.; 125° C. and 145° C.; 140° C. and 150° C.; or 120° C. and 140° C.

The layers may be heated for various periods of time. In various implementations, the layers may be heated for about 10 minutes to about 90 minutes. In various implementations, the layers may be heated for no more than 90 minutes; no more than 75 minutes; no more than 60 minutes; no more than 45 minutes; no more than 30 minutes; no more than 20 minutes; or no more than 15 minutes. In various implementations, the layers may be heated for no less than 10 minutes; no less than 15 minutes; no less than 20 minutes; no less than 30 minutes; no less than 45 minutes; no less than 60 minutes; or no less than 75 minutes. In various implementations, the layers may be heated for 10-90 minutes; 10-60 minutes; 10-30 minutes; 10-20 minutes; 10-15 minutes; or 15-60 minutes.

After oxidizing, in some instances a photoresist layer may be deposited onto the second layer of the solid electrolyte. A photoresist layer may comprise light sensitive chemicals and may generally include polymer, sensitizer, and solvent.

An electrolyte channel may be patterned into the solid electrolyte. The electrolyte channel may be patterned into the second layer or into both the second layer and the first layer. Exemplary electrolyte channel widths and lengths are described in greater detail above.

After oxidizing operations, an anode and a cathode are deposited onto the same surface of the solid electrolyte. Depositing the anode and cathode may be performed using e-beam evaporation. Probe pads may also be attached to the anode and cathode for external connections. Depositing the anode and cathode is performed to align each with the electrolyte channel.

The solid electrolyte with the anode and the cathode may be subjected to a constant voltage bias for a predetermined period of time. In various instances, a voltage may range from about 0 V to about 100 V. Subjecting the solid electrolyte to a voltage bias may be performed for various time periods, which may range from 100-500 microseconds to 100-500 hours to 5-10 years.

III. Experimental Examples

Two sets of experimental lateral programmable metallization cells were produced. The experimental examples were evaluated to determine the capability of the bilayer solid electrolyte to support electrodeposition between surface electrodes. Various aspects of the experiments are discussed below.

The fabrication started with a 200 nm thick $Si_3N_4$ layer deposited by low pressure chemical vapor deposition (LPCVD) on 4-inch silicon wafers. All layers were patterned using a photolithography—e-beam evaporation—lift-off sequence. First, the electrolyte pattern was formed in bilayer of OCG825 and AZ3312 spun on the $Si_3N_4$/Si using OAI 808 aligner. Then a $Cu/WO_3$ stack with two thicknesses of Cu to provide different amounts of the metal for the oxidation/diffusion process was e-beam evaporated on the patterned resist using a Lesker PVD75 deposition system. The $WO_3$ thickness was 80 nm in all cases and 10 nm of Cu was deposited for "device 1" and 30 nm of copper was deposited for "device 2." The $Cu/WO_3$ stack was then patterned by acetone liftoff to produce an electrolyte channel width of 50 µm.

Subsequently, device 1 was annealed in air at 135° C. for 13 minutes and device 2 was annealed in air at 155° C. for 60 minutes. These times and temperatures were chosen to ensure complete Cu oxidation/diffusion so that no metallic Cu was left in the stack which would reduce the bias between the electrodes and thereby prevent electrodeposition. It was determined by materials analysis and modeling that the copper oxide layer was 8 nm thick in device 1 and 30 nm thick in device 2. The total amount of copper in the 80 nm thick $WO_3$ layer was similar for both samples; the total amount of Cu was $5.48 \times 10^{21}$ atoms in device 1 and $1.25 \times 10^{22}$ atoms in device 2. The Ni cathode and Cu anode and their probe pads for external connections were then deposited on top of the electrolyte layer using e-beam evaporation in the Lesker PVD75 and patterned by the lift-off sequence described above to produce an electrolyte channel length of 14 µm in both devices.

Figure 4:
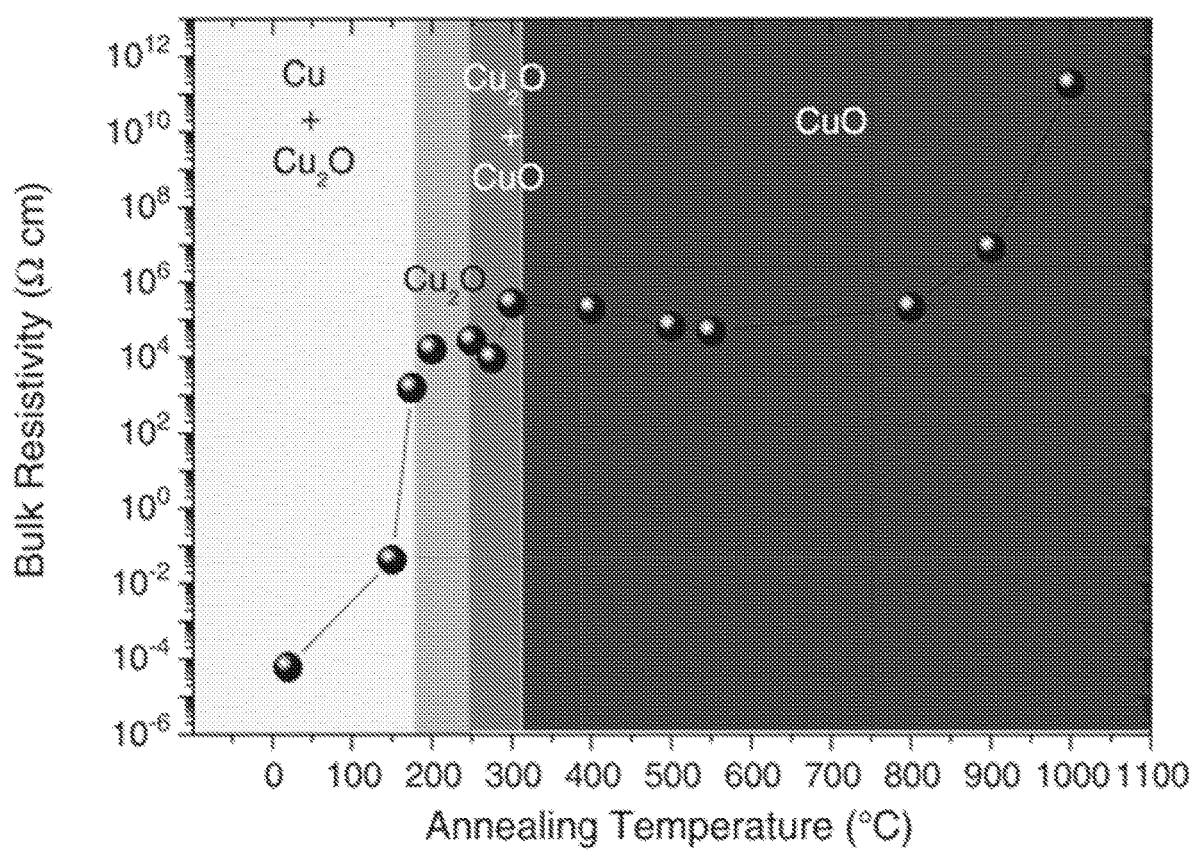
FIG. 4 is a graph of one example of resistivity and composition of copper oxide formed at various temperatures.

To form the electrodeposits, the devices were subjected to a constant voltage bias using an Agilent 4155C parameter analyzer connected via tungsten probes on a MicroZoom probe station to the probe pads, and the current was measured over time. The starting resistance (HRS) for device 1 was 15 giga-ohms and for device 2, which had considerably more starting copper thickness, was 25 mega-ohms Using the starting resistance and device dimensions, and assuming that the copper oxide layer has a lower resistance than the Cu-doped $WO_3$, the copper oxide resistivity in device 1 is $4.3 \times 10^4$ Ωcm which implies using the information in FIG. 4 that the device has "pure" $Cu_2O$ and the layer resistivity in device 2 is $2.7 \times 10^2$ Ωcm which implies a $Cu_2O$+Cu mix.

Figure 5:
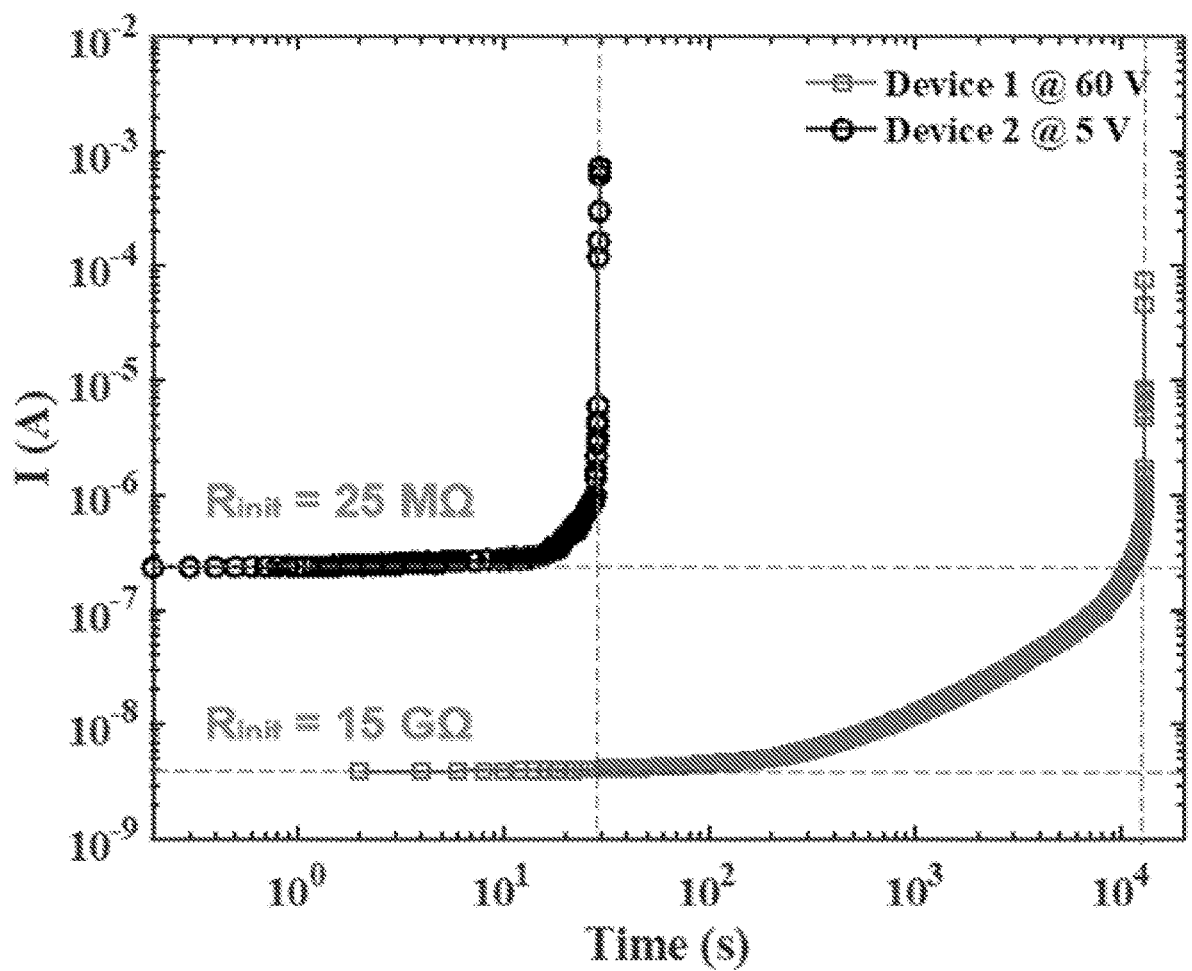
FIG. 5 illustrates two examples of current-time plots for two lateral devices showing initial current/resistance and the point at which the electrodeposit bridges the channel between the electrodes.

A voltage of 5 volts was applied to the anode of device 2 while the cathode was grounded and this resulted in an electrodeposit that bridged the channel in 29 seconds, as determined by the point where the current in the channel abruptly reached the compliance limit as shown in FIG. 5. The same voltage for device 1 resulted in no appreciable change in resistance during the test period and so the bias was increased to 60 volts and this resulted in the channel being bridged in around 3.5 hours, also shown in FIG. 5. The LRS in both devices was determined by the current compliance (which is typical for PMC/CBRAM structures) but could easily be set to a few hundred ohms at the highest compliance level (10 mA), demonstrating the high dynamic range of these structures. Note that the average electrodeposition rates for these bias conditions were 0.0011 µm/s and 0.48 µm/s for device 1 and device 2 respectively. The much higher electrodeposition rate for device 2 at a much lower voltage than was applied to device 1 is a direct result of the lower resistance of the overlying copper oxide layer in device 2 since the Cu—$WO_3$ electrolyte was quite similar in composition in both cases.

Figure 6A:
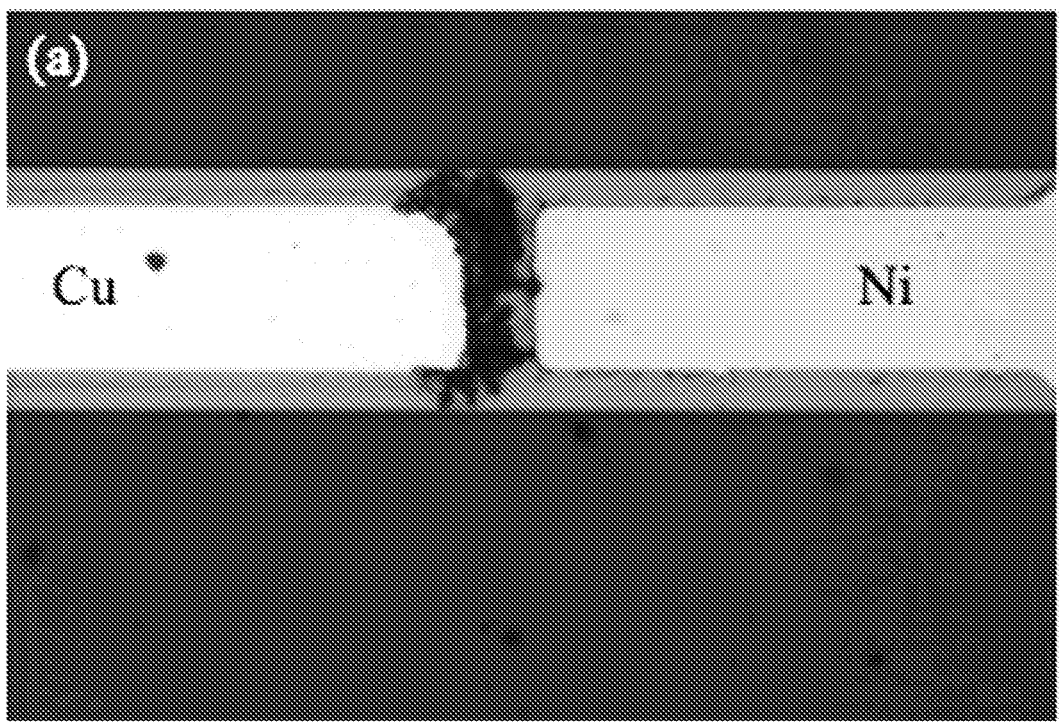
FIG. 6A is a top view optical micrograph of a first embodiment of a lateral PMC (referred to herein as" device "1).
Figure 6B:
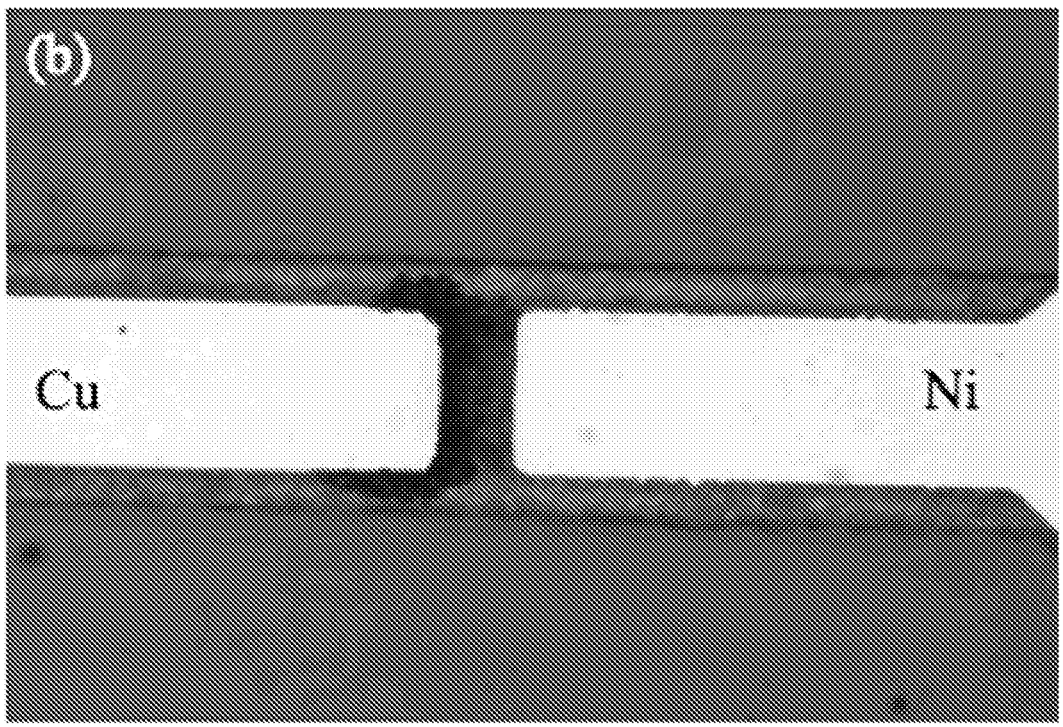
FIG. 6B is a top view optical micrograph of second embodiment of a lateral PMC (referred to herein as "device 2").

Top view optical micrographs of the devices following bridging after biasing are illustrated in FIG. 6. The optical micrographs of the devices showing Cu anode and Ni cathode and the electrodeposited Cu in the 14 µm long channel. The electrodeposited copper between the electrodes is visible (note that it appears to be dark in the micrographs due to its inherent roughness). A broader electrodeposit at the copper anode is due to the higher copper concentration in the electrolyte which promotes early deposition of metal in this region.

The disclosure provides lateral programmable metallization cells that electro-deposit metal ions to bridge the channel utilizing a solid electrolyte between a pair of electrodes for potential applications, such as, to make integrated electronics, microfluidic valves, switches, interconnects, tunneling elements in micro-electrochemical system (MEMS) circuits, semiconductors, and etc. The disclosed lateral PMCs function by using a novel Bilayer Solid Electrolyte (BSE) comprised of a copper film layer on a tungsten oxide layer as a medium for ion diffusion. When the copper film is oxidized, simultaneously the metal ions travel through the oxide layer to be reduced with the electron to construct a nano-bridge in the channel. Due to the closer proximity of the electron cathodic supply to the areas of higher abundance of metal ions from the anodic supply that can be rapidly electro-deposited, a faster growth rate is achieved when compared to current known methods.

For the recitation of numeric ranges herein, each intervening number there between with the same degree of precision is explicitly contemplated. For example, for the range of 6-9, the numbers 7 and 8 are contemplated in addition to 6 and 9, and for the range 6.0-7.0, the number 6.0, 6.1, 6.2, 6.3, 6.4, 6.5, 6.6, 6.7, 6.8, 6.9, and 7.0 are explicitly contemplated.

The modifier "about" used in connection with a quantity is inclusive of the stated value and has the meaning dictated by the context (for example, it includes at least the degree of error associated with the measurement of the particular quantity). The modifier "about" should also be considered as disclosing the range defined by the absolute values of the two endpoints. For example, the expression "from about 2 to about 4" also discloses the range "from 2 to 4." The term "about" may refer to plus or minus 10% of the indicated number. For example, "about 10%" may indicate a range of 9% to 11%, and "about 1" may mean from 0.9-1.1. Other meanings of "about" may be apparent from the context, such as rounding off, so, for example "about 1" may also mean from 0.5 to 1.4.

Various features and advantages of the disclosure are set forth in the following claims.

What is claimed is:

1. A lateral programmable metallization cell, comprising:
   a solid electrolyte layer including
      a first layer comprising an oxide electrolyte and a copper species; and
      a second layer comprising metallic copper (Cu) and copper oxide ($Cu_2O$), the second layer coupled to the first layer;
   an anode coupled to the solid electrolyte layer; and
   a cathode coupled to the solid electrolyte layer.

2. The lateral programmable metallization cell of claim 1, wherein the oxide electrolyte comprises tungsten trioxide.

3. The lateral programmable metallization cell of claim 1, wherein the oxide electrolyte comprises silicon oxide.

4. The lateral programmable metallization cell of claim 1, wherein the oxide electrolyte comprises tantalum pentoxide.

5. The lateral programmable metallization cell of claim 1, wherein a thickness of the first layer is between one nanometer and 900 nanometers.

6. The lateral programmable metallization cell of claim 1, wherein a thickness of the second layer is between one nanometer and 50 nanometers.

7. The lateral programmable metallization cell of claim 1, wherein the cathode comprises nickel, and wherein the anode comprises copper.

* * * * *